| United States Patent [19] | [11] Patent Number: 5,026,500 |
| Vianello | [45] Date of Patent: Jun. 25, 1991 |

[54] SOLVENT COMPOSITION FOR DEFLUXING PRINTED CIRCUITS

[75] Inventor: Domenico Vianello, Venezia, Italy

[73] Assignee: Ausimont S.r.l., Milan, Italy

[21] Appl. No.: 403,388

[22] Filed: Sep. 6, 1989

[30] Foreign Application Priority Data

Sep. 7, 1988 [IT] Italy .................................. 21842 A/88

[51] Int. Cl.$^5$ .......................... C09D 9/00; C11D 7/50; C23G 5/028
[52] U.S. Cl. .................................... 252/171; 252/172; 252/170; 252/364
[58] Field of Search ......... 252/171, 172, 364, DIG. 9, 252/170

[56] References Cited

U.S. PATENT DOCUMENTS

| 2,902,454 | 9/1959 | Moore | 252/364 |
| 3,397,150 | 8/1968 | Burt et al. | 252/364 |
| 3,530,073 | 9/1970 | Clark et al. | 252/170 |
| 3,573,213 | 3/1971 | Burt | 252/172 |
| 3,903,009 | 9/1975 | Bauer et al. | 252/364 |
| 3,957,531 | 5/1976 | Tipping et al. | 252/171 |
| 3,960,746 | 6/1976 | Gorski | 252/171 |
| 4,246,154 | 1/1981 | Yao | 524/88 |
| 4,606,844 | 8/1986 | Aguiléra et al. | 252/364 |

FOREIGN PATENT DOCUMENTS

| 0361702 | 4/1990 | European Pat. Off. . |
| 2279439 | 2/1976 | France . |
| 1168710 | 10/1969 | United Kingdom . |
| 2076009 | 11/1981 | United Kingdom . |

OTHER PUBLICATIONS

European Search Report dated Aug. 12, 1989.

*Primary Examiner*—A. Lionel Clingman
*Assistant Examiner*—J. Darland
*Attorney, Agent, or Firm*—Morgan & Finnegan

[57] ABSTRACT

A solvent composition is taught which comprises chlorofluorocarbons, ethanol, nitroalkane and phosphoric esters. This composition is suited to clean printed circuits at room temperature.

4 Claims, No Drawings

SOLVENT COMPOSITION FOR DEFLUXING PRINTED CIRCUITS

FIELD OF THE INVENTION

The present invention relates to a composition comprising chlorofluorocarbons, ethanol, nitroalkane and phosphoric esters. The solvent is utilized for the cold cleaning of printed circuits without causing corrosion phenomena.

BACKGROUND OF THE INVENTION

The printed circuits utilized in the electronic industry consist of a plastic laminate optionally reinforced with electrically resistant glass fibers. Connectors are placed on one side or both sides of such laminate. The connectors are made of flat strips of a conductive metal, usually copper. They serve to connect with one another the electronic components arranged on one side of the printed circuit.

The connection between the above connectors and the electronic components is obtained by welding or soldering.

Welding or soldering of the printed circuits is effected after having coated the whole circuit with a flux consisting of a resin containing activating additives such as, for example, amine hydrochlorides.

The flux prevents or removes the corrosion of the conductive material by promoting welding adhesion.

After the welding process, which causes a thermal degradation of part of the flux, the flux residues are removed using organic solvents.

The chlorofluorocarbons, due to their low toxicity and inflammability, prove to be the most suitable solvents for such utilization.

On the other hand, however, these solvents do not exhibit an adequate capability of dissolving the flux.

To enhance the dissolving power of the chlorofluorocarbons towards the flux residues, a mixture with more active solvents, such as e.g. alcohols with a low number of carbon atoms, has been proposed.

In particular, because the mixture is utilized at boiling, the alcohols are present in the solvent mixture in such concentration as to form an azeotrope with the chlorofluorcarbon.

However, with this solvent composition, because the printed circuit cleaning occurs in hot conditions, while the solubility of the flux in the solvent increases, the alcohol contained in the mixture gives rise, at the same time, to corrosion of Al, Sn and Pb, Zn, Cu, Ni and Fe metal surfaces.

By consequence, low nitromethane concentrations have been added to the above azeotropic compositions.

U.S. Pat. No. 3,903,009, hereby incorporated by reference, describes an azeotropic minimum composition containing 95.3% by weight of 1,1,2-trichloro-1,2,2-trofluoroethane, 3.6% by weight of ethanol and 1.1% by weight of nitromethane. This composition is useful to clean printed circuits.

However, this composition exhibits several drawbacks.

After application of the composition, white residues, due to the flux corrosion, remain on the printed circuit.

On the other hand, this solvent mixture must be used in hot conditions. From an industrial viewpoint, that requires more complicated cleaning apparatus equipped with heaters, and therefore higher energy consumptions.

Furthermore, although such mixtures are inflammable, they can decompose when coming into contact with hot surfaces. This generates toxic and corrosive vapors, which are dangerous for plant operators. At the same time, because it is practically impossible to separate the generated decomposed vapors from the ones of the fluxing mixture, this results in corrosion of the metal surfaces.

Therefore, it is a necessity to find mixtures for defluxing the printed circuits, which mixtures are capable of securing a thorough removal of the flux and which, at the same time, do not give rise to the mentioned drawbacks.

DETAILED DESCRIPTION OF THE INVENTION

From an industrial viewpoint, it was necessary to have available precleaner solvent compositions with a low corrosion power to increase the long-term productivity of the printed circuits.

It is now surprisingly been found that the use of particular compositions as specified hereinbelow permits drastically reducing the corrosion in the printed circuits.

Thus, an object of the present invention is the composition comprising:

(a) from 4 to 10%, preferably from 6 to 9% by weight of ethyl alcohol;

(b) from 0.5 to 1.5%, preferably from 0.6 to 1.2% by weight of a nitroalkane having 1 to 3 carbon atoms;

(c) from 0.5 to 10%, preferably from 2 to 6% by weight of a phosphoric mono- and/or di-ester of formula:

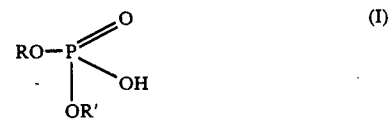

wherein R is an alkyl group having a number of carbon atoms higher than 11 and lower than 18 and R' represents H or R;

(d) the balance to 100% of perfluorochlorocarbons having 1 to 3 carbon atoms.

In fact, this composition exhibits a higher anticorrosive power towards the above-cited metals and at the same time a higher cleaning power towards the fluxes utilized during welding compared with the prior art compositions utilized for hot defluxing.

Furthermore, Applicant has ascertained by testing that the compositions containing a phosphoric ester, where R and/or R' has a number of carbon atoms greater than 11 and in particular greater than or equal to 12, have a considerably reduced corrosive power compared with similar compositions, in which the phosphoric ester has R and/or R' containing a number of carbon atoms less than or equal to 10.

This result is fully surprising and unexpected because it could not have been foreseen that even a slight variation in the carbon atom number would lead to such results.

EXAMPLES

The following examples are given for merely illustrative purposes. They are not to be construed to limit the present invention.

EXAMPLE 1

Into each of three glass containers having a 300 cm$^3$ volume, a complete 40×40 mm printed circuit was introduced. Into each of these containers there were introduced 150 cm$^3$ of three precleaner compositions containing the following components in the following concentrations:

- 88% by weight of 1,1,2-trichloro-1,2,2-trifluoroethane;
- 1% by weight of nitromethane;
- 8% by weight of ethanol;
- 3% by weight of phosphoric ester, with the only difference that each composition contained a different phosphoric ester.

In particular, composition No. 1 contained a mixture of phosphoric mono- and diester in a concentration of 60% and 40% by weight respectively, the alkyl radicals of which were composed of 4 carbon atoms. Composition No. 2 contained a mixture of phosphoric mono- and diester having 10 carbon atoms in a concentration of 60% and 40% by weight respectively. Composition No. 3 contained a mixture of phosphoric mono- and diester, the alkyl radical of which had 12 carbon atoms in a concentration of 60% and 40% by weight respectively.

Each container was sealed. The printed circuit was maintained immersed in the precleaner composition during 90 days. After this period of time, the precleaner was withdrawn and analyzed according to the method based on atomic absorption spectrophotometry.

The following results were obtained: Analyzed element concentration expressed in p.p.m.

| Composition No. | Al | Fe | Ni | Cu | Pb | Sn |
|---|---|---|---|---|---|---|
| 1 | 42 | 16 | 29 | 220 | 30 | 370 |
| 2 | 22 | 8 | 17 | 162 | 15 | 290 |
| 3 | 1.7 | 0.5 | 1.3 | 12 | 1.1 | 60 |

EXAMPLE 2

The same printed circuits utilized in the preceding example were cleaned in a three-tub ultrasonic cleaning machine (where the first tub was separated from the other two).

Such cleaning occurred by immersing for 3 minutes in sequence the three samples into the three tubs (the third tub being maintained at boiling, while the first two were maintained at room temperature), which had been previously filled with the azeotrope formed by 96% by weight of the trichlorofluoethane of Example 1, 3% by weight of ethanol and 1% by weight of nitromethane (composition B).

The same operation was repeated after having changed the product in the first tub and after having introduced a mixture having the same composition specified in Example 1 (composition A), where radical R of phosphoric ester was composed of 12 carbon atoms.

After cleaning, the two groups of printed circuits were examined under an ALPHA 500 ionograph. The results were as follows:

|  | Residual contamination in uGM/SQ expressed as NaCl |
|---|---|
| Composition A | 1.0 |
| Composition B | 16.2 |

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

I claim:

1. A solvent composition suitable for cleaning printed circuits at room temperature which comprises:
   - (a) from 4 to 10% by weight of ethyl alcohol;
   - (b) from 0.5 to 1.5% by weight of a nitroalkane having 1 to 3 carbon atoms;
   - (c) from 0.5 to 10% by weight of a phosphoric mono- and/or diester of formula I

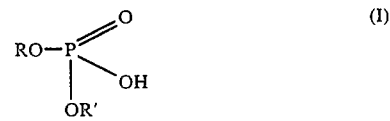

wherein R is an alkyl group having a number of carbon atoms greater than 11 and less than 18 and R' is H or R; and
   - (d) from 95% to 78.5% by weight of perfluorochlorocarbons having 1 to 3 carbon atoms.

2. The solvent composition according to claim 1, wherein the phosphoric ester of formula (I) exhibits an alkyl radical R and/or R' having a number of carbon atoms greater than or equal to 12.

3. The solvent composition according to claim 1, comprising:
   - (a) from 6 to 9% by weight of ethyl alcohol;
   - (b) from 0.6 to 1.2% by weight of nitroalkane having 1 to 3 carbon atoms;
   - (c) from 2 to 6% by weight of a phosphoric mono- and/or diester; and
   - (d) from 91.4% to 83.8% by weight of a perfluorochlorocarbon having 1 to 3 carbon atoms.

4. The solvent composition according to claim 1, comprising the following components:
   - (a) 8% by weight of ethanol;
   - (b) 1% by weight of nitromethane;
   - (c) 3% by weight of phosphoric mono- and/or diester in which R and/or R' has 12 carbon atoms;
   - (d) 88% by weight of 1,1,2-trichloro-1,2,2-trifluoroethane.

* * * * *